United States Patent
Poblenz et al.

(10) Patent No.: US 8,465,588 B2
(45) Date of Patent: *Jun. 18, 2013

(54) AMMONOTHERMAL METHOD FOR GROWTH OF BULK GALLIUM NITRIDE

(75) Inventors: Christiane Poblenz, Goleta, CA (US); James S. Speck, Goleta, CA (US); Derrick S. Kamber, Goleta, CA (US)

(73) Assignee: SORAA, Inc., Fremont, CA (US)

( * ) Notice: Subject to any disclaimer, the term of this patent is extended or adjusted under 35 U.S.C. 154(b) by 75 days.

This patent is subject to a terminal disclaimer.

(21) Appl. No.: 13/175,739

(22) Filed: Jul. 1, 2011

(65) Prior Publication Data

US 2011/0262773 A1    Oct. 27, 2011

Related U.S. Application Data

(63) Continuation of application No. 12/556,558, filed on Sep. 9, 2009, now Pat. No. 7,976,630.

(60) Provisional application No. 61/178,460, filed on May 14, 2009, provisional application No. 61/096,304, filed on Sep. 11, 2008.

(51) Int. Cl.
*C30B 23/06* (2006.01)

(52) U.S. Cl.
USPC ............... 117/99; 117/86; 117/100; 117/104; 117/105

(58) Field of Classification Search
USPC ............... 117/100, 99, 105, 104, 86
See application file for complete search history.

(56) References Cited

U.S. PATENT DOCUMENTS

| | | |
|---|---|---|
| 6,398,867 B1 | 6/2002 | D'Evelyn et al. |
| 6,533,874 B1 | 3/2003 | Vaudo et al. |
| 6,596,079 B1 | 7/2003 | Vaudo et al. |
| 6,639,925 B2 | 10/2003 | Niwa et al. |
| 6,656,615 B2 | 12/2003 | Dwilinski et al. |
| 6,764,297 B2 | 7/2004 | Godwin et al. |
| 6,765,240 B2 | 7/2004 | Tischler et al. |
| 6,784,463 B2 | 8/2004 | Camras et al. |
| 6,787,814 B2 | 9/2004 | Udagawa |
| 6,858,882 B2 | 2/2005 | Tsuda et al. |
| 6,861,130 B2 | 3/2005 | D'Evelyn et al. |

(Continued)

FOREIGN PATENT DOCUMENTS

| | | |
|---|---|---|
| JP | 2005289797 | 10/2005 |
| WO | 2007/004495 | 1/2007 |
| WO | 2012/016033 | 2/2012 |

OTHER PUBLICATIONS

Amano et al., "Metalorganic Vapor Phase Epitaxial Growth of a High Quality GaN Film Using an AlN Buffer Layer," 1986, Applied Physics Letter, vol. 48, No. 353, pp. 353-355.

(Continued)

*Primary Examiner* — Bob M Kunemund
(74) *Attorney, Agent, or Firm* — Kilpatrick Townsend & Stockton LLP

(57) ABSTRACT

A high-quality, large-area seed crystal for ammonothermal GaN growth and method for fabricating. The seed crystal comprises double-side GaN growth on a large-area substrate. The seed crystal is of relatively low defect density and has flat surfaces free of bowing. The seed crystal is useful for producing large-volume, high-quality bulk GaN crystals by ammonothermal growth methods for eventual wafering into large-area GaN substrates for device fabrication.

45 Claims, 7 Drawing Sheets

U.S. PATENT DOCUMENTS

| | | |
|---|---|---|
| 7,001,577 B2 | 2/2006 | Zimmerman et al. |
| 7,012,279 B2 | 3/2006 | Wierer, Jr. et al. |
| 7,053,413 B2 | 5/2006 | D'Evelyn et al. |
| 7,063,741 B2 | 6/2006 | D'Evelyn et al. |
| 7,078,731 B2 | 7/2006 | D'Evelyn et al. |
| 7,098,487 B2 | 8/2006 | D'Evelyn et al. |
| 7,112,829 B2 | 9/2006 | Picard et al. |
| 7,119,372 B2 | 10/2006 | Stokes et al. |
| 7,125,453 B2 | 10/2006 | D'Evelyn et al. |
| 7,160,531 B1 | 1/2007 | Jacques et al. |
| 7,175,704 B2 | 2/2007 | D'Evelyn et al. |
| 7,198,671 B2 | 4/2007 | Ueda |
| 7,211,833 B2 | 5/2007 | Slater, Jr. et al. |
| 7,252,712 B2 | 8/2007 | Dwilinski et al. |
| 7,285,801 B2 | 10/2007 | Eliashevich et al. |
| 7,316,746 B2 | 1/2008 | D'Evelyn et al. |
| 7,368,015 B2 | 5/2008 | D'Evelyn et al. |
| 7,420,261 B2 | 9/2008 | Dwilinski et al. |
| 7,625,446 B2 | 12/2009 | D'Evelyn et al. |
| 7,642,122 B2 | 1/2010 | Tysoe et al. |
| 7,704,324 B2 | 4/2010 | D'Evelyn et al. |
| 7,705,276 B2 | 4/2010 | Giddings et al. |
| 7,759,710 B1 | 7/2010 | Chiu et al. |
| 7,871,839 B2 | 1/2011 | Lee et al. |
| 7,976,630 B2 * | 7/2011 | Poblenz et al. ............ 117/86 |
| 8,021,481 B2 | 9/2011 | D'Evelyn |
| 8,048,225 B2 | 11/2011 | Poblenz et al. |
| 8,097,081 B2 | 1/2012 | D'Evelyn |
| 8,148,801 B2 | 4/2012 | D'Evelyn |
| 8,188,504 B2 | 5/2012 | Lee |
| 8,198,643 B2 | 6/2012 | Lee et al. |
| 8,207,548 B2 | 6/2012 | Nagai |
| 8,284,810 B1 | 10/2012 | Sharma et al. |
| 8,299,473 B1 | 10/2012 | D'Evelyn et al. |
| 8,303,710 B2 | 11/2012 | D'Evelyn |
| 8,306,081 B1 | 11/2012 | Schmidt et al. |
| 8,323,405 B2 | 12/2012 | D'Evelyn |
| 8,329,511 B2 | 12/2012 | D'Evelyn |
| 2001/0009134 A1 | 7/2001 | Kim et al. |
| 2001/0048114 A1 | 12/2001 | Morita et al. |
| 2002/0070416 A1 | 6/2002 | Morse et al. |
| 2002/0105986 A1 | 8/2002 | Yamasaki |
| 2002/0182768 A1 | 12/2002 | Morse et al. |
| 2002/0189532 A1 | 12/2002 | Motoki et al. |
| 2003/0140845 A1 | 7/2003 | D'Evelyn et al. |
| 2003/0164507 A1 | 9/2003 | Edmond et al. |
| 2003/0183155 A1 | 10/2003 | D'Evelyn et al. |
| 2003/0209191 A1 | 11/2003 | Purdy |
| 2003/0232512 A1 | 12/2003 | Dickinson et al. |
| 2004/0000266 A1 | 1/2004 | D'Evelyn et al. |
| 2004/0023427 A1 | 2/2004 | Chua et al. |
| 2004/0124435 A1 | 7/2004 | D'Evelyn et al. |
| 2004/0161222 A1 | 8/2004 | Niida et al. |
| 2005/0087753 A1 | 4/2005 | D'Evelyn et al. |
| 2005/0098095 A1 | 5/2005 | D'Evelyn et al. |
| 2005/0109240 A1 | 5/2005 | Maeta et al. |
| 2005/0121679 A1 | 6/2005 | Nagahama et al. |
| 2005/0128469 A1 | 6/2005 | Hall et al. |
| 2005/0152820 A1 | 7/2005 | D'Evelyn et al. |
| 2005/0167680 A1 | 8/2005 | Shei et al. |
| 2005/0205215 A1 | 9/2005 | Giddings et al. |
| 2005/0263791 A1 | 12/2005 | Yanagihara et al. |
| 2006/0032428 A1 | 2/2006 | Dwilinski et al. |
| 2006/0037529 A1 | 2/2006 | D'Evelyn et al. |
| 2006/0037530 A1 | 2/2006 | Dwilinski et al. |
| 2006/0048699 A1 | 3/2006 | D'Evelyn et al. |
| 2006/0096521 A1 | 5/2006 | D'Evelyn et al. |
| 2006/0118799 A1 | 6/2006 | D'Evelyn et al. |
| 2006/0163589 A1 | 7/2006 | Fan et al. |
| 2006/0169993 A1 | 8/2006 | Fan et al. |
| 2006/0177362 A1 | 8/2006 | D'Evelyn et al. |
| 2006/0207497 A1 | 9/2006 | D'Evelyn et al. |
| 2006/0213429 A1 | 9/2006 | Motoki et al. |
| 2006/0214287 A1 | 9/2006 | Ogihara et al. |
| 2006/0255343 A1 | 11/2006 | Ogihara et al. |
| 2007/0057337 A1 | 3/2007 | Kano et al. |
| 2007/0096239 A1 | 5/2007 | Cao et al. |
| 2007/0105351 A1 | 5/2007 | Motoki et al. |
| 2007/0114569 A1 | 5/2007 | Wu et al. |
| 2007/0121690 A1 | 5/2007 | Fujii et al. |
| 2007/0131967 A1 | 6/2007 | Kawaguchi et al. |
| 2007/0141819 A1 | 6/2007 | Park et al. |
| 2007/0142204 A1 | 6/2007 | Park et al. |
| 2007/0158785 A1 | 7/2007 | D'Evelyn et al. |
| 2007/0178039 A1 | 8/2007 | D'Evelyn et al. |
| 2007/0181056 A1 | 8/2007 | D'Evelyn et al. |
| 2007/0210074 A1 | 9/2007 | Maurer et al. |
| 2007/0215033 A1 | 9/2007 | Imaeda et al. |
| 2007/0218703 A1 | 9/2007 | Kaeding et al. |
| 2007/0228404 A1 | 10/2007 | Tran et al. |
| 2007/0274359 A1 | 11/2007 | Takeuchi et al. |
| 2007/0290224 A1 | 12/2007 | Ogawa |
| 2008/0006831 A1 | 1/2008 | Ng |
| 2008/0023691 A1 | 1/2008 | Jang et al. |
| 2008/0025360 A1 | 1/2008 | Eichler et al. |
| 2008/0073660 A1 | 3/2008 | Ohno et al. |
| 2008/0083741 A1 | 4/2008 | Giddings et al. |
| 2008/0083929 A1 | 4/2008 | Fan et al. |
| 2008/0087919 A1 | 4/2008 | Tysoe et al. |
| 2008/0106212 A1 | 5/2008 | Yen et al. |
| 2008/0121906 A1 | 5/2008 | Yakushiji |
| 2008/0128752 A1 | 6/2008 | Wu |
| 2008/0156254 A1 | 7/2008 | Dwilinski et al. |
| 2008/0198881 A1 | 8/2008 | Farrell et al. |
| 2008/0211416 A1 | 9/2008 | Negley et al. |
| 2008/0230765 A1 | 9/2008 | Yoon et al. |
| 2008/0282978 A1 | 11/2008 | Butcher et al. |
| 2008/0285609 A1 | 11/2008 | Ohta et al. |
| 2008/0298409 A1 | 12/2008 | Yamashita et al. |
| 2009/0078955 A1 | 3/2009 | Fan et al. |
| 2009/0092536 A1 | 4/2009 | Kawabata et al. |
| 2009/0146170 A1 | 6/2009 | Zhong et al. |
| 2009/0218593 A1 | 9/2009 | Kamikawa et al. |
| 2009/0250686 A1 | 10/2009 | Sato et al. |
| 2009/0301387 A1 | 12/2009 | D'Evelyn |
| 2009/0301388 A1 | 12/2009 | D'Evelyn |
| 2009/0309110 A1 | 12/2009 | Raring et al. |
| 2009/0320745 A1 | 12/2009 | D'Evelyn et al. |
| 2010/0001300 A1 | 1/2010 | Raring et al. |
| 2010/0003492 A1 | 1/2010 | D'Evelyn |
| 2010/0025656 A1 | 2/2010 | Raring et al. |
| 2010/0031872 A1 | 2/2010 | D'Evelyn |
| 2010/0031873 A1 | 2/2010 | D'Evelyn |
| 2010/0031874 A1 | 2/2010 | D'Evelyn |
| 2010/0031875 A1 | 2/2010 | D'Evelyn |
| 2010/0031876 A1 | 2/2010 | D'Evelyn |
| 2010/0032691 A1 | 2/2010 | Kim |
| 2010/0108985 A1 | 5/2010 | Chung et al. |
| 2010/0109030 A1 | 5/2010 | Krames et al. |
| 2010/0117101 A1 | 5/2010 | Kim et al. |
| 2010/0117118 A1 | 5/2010 | Dabiran et al. |
| 2010/0147210 A1 | 6/2010 | D'Evelyn |
| 2010/0151194 A1 | 6/2010 | D'Evelyn |
| 2010/0295088 A1 | 11/2010 | D'Evelyn et al. |
| 2011/0017298 A1 | 1/2011 | Lee |
| 2011/0100291 A1 | 5/2011 | D'Evelyn |
| 2011/0108081 A1 | 5/2011 | Werthen et al. |
| 2011/0121331 A1 | 5/2011 | Simonian et al. |
| 2011/0175200 A1 | 7/2011 | Yoshida |
| 2011/0183498 A1 | 7/2011 | D'Evelyn |
| 2011/0220912 A1 | 9/2011 | D'Evelyn |
| 2011/0256693 A1 | 10/2011 | D'Evelyn et al. |
| 2012/0000415 A1 | 1/2012 | D'Evelyn et al. |
| 2012/0007102 A1 | 1/2012 | Feezell et al. |
| 2012/0073494 A1 | 3/2012 | D'Evelyn |
| 2012/0091465 A1 | 4/2012 | Krames et al. |
| 2012/0118223 A1 | 5/2012 | D'Evelyn |
| 2012/0137966 A1 | 6/2012 | D'Evelyn et al. |
| 2012/0187412 A1 | 7/2012 | D'Evelyn et al. |
| 2012/0199952 A1 | 8/2012 | D'Evelyn et al. |

OTHER PUBLICATIONS

Baker et al., "Characterization of Planar Semipolar Gallium Nitride Films on Spinel Substrates," 2006, Japanese Journal of Applied Physics, No. 29, pp. L154-L157.

Baker et al., "Characterization of Planar Semipolar Gallium Nitride Films on Spinel Substrates," 2005, Japanese Journal of Applied Physics, vol. 44, No. 29, pp. L920-L922.

Cantu et al., "Si Doping Effect on Strain Reduction in Compressively Strained Al0.49Ga0.51N Thin Films" 2003, Applied Physics Letter, vol. 83, No. 4, pp. 674-676.

Chakraborty et al., "Defect Reduction in a Nonpolar a-Plane GaN Films Using in situ SiNx Nanomask", 2006, Applied Physics Letters, vol. 89, pp. 041903-1-041903-3.

Corrion et al., "Structural and Morphological Properties of GaN Buffer Layers Grown by Ammonia Molecular Beam Epitaxy on SiC Substrates for AlGaN/GaN High Electron Mobility Transistors," 2008, Journal of Applied Physics, vol. 103, pp. 093529-1-093529-7.

Davidsson et al., "Effect of AlN Nucleation Layer on the Structural Properties of Bulk GaN Grown on Sapphire by Molecular-beam Epitaxy," 2005, Journal of Applied Physics, vol. 98, pp. 016109-1-016109-3.

D'Evelyn et al., "Bulk GaN Crystal Growth by the High-Pressure Ammonothermal Method," 2007, Journal of Crystal Growth, vol. 300, pp. 11-16.

Grandjean et al., "Nitridation of Sapphire. Effect on the Optical Properties of GaN Epitaxial Overlayers," 1996, Applied Physics Letters, vol. 69, No. 18, pp. 2071-2073.

Green et al., "Polarity Control During Molecular Beam Epitaxy Growth of Mg-doped GaN," 2003, Journal of Vacuum Science Technology, vol. B-21, No. 4, pp. 1804-1811.

Hellman et al., "The Polarity of GaN: a Critical Review," 1998, MRS Internet Journal Nitride Semiconductor Research, vol. 3, No. 11, pp. 1-11.

Heying et al., "Control of GaN Surface Morphologies Using Plasma-Assisted Molecular Beam Epitaxy," 2000, Journal of Applied Physics, vol. 88, No. 4, pp. 1855-1860.

Katona et al., "Observation of Crystallographic Wing Tilt in Cantilever Epitaxy of GaN on Silicon Carbide and Silicon (111) Substrates", 2001, Applied Physics Letters, vol. 79, No. 18, pp. 2907-2909.

Keller et al., "Influence of the Substrate Misorientation on the Properties of N-polar GaN Films Grown by Metal Organic Chemical Vapor Deposition," 2007, Journal of Applied Physics, vol. 102, pp. 083546-1-083546-6.

Keller et al., "Influence of Sapphire Nitridation on Properties of Gallum Nitride Grown by Metalorganic Chemical Vapor Deposition," 1996, Applied Physics Letters, vol. 68, No. 11, pp. 1525-1527.

Koblmuller et al., High Electron Mobility GaN Grown Under N-rich Conditions by Plasma-assisted Molecular Beam Epitaxy, 2007, Applied Physics Letters, vol. 91, pp. 221905-1-221905-3.

Koblmuller et al., "In Situ Investigation of Growth Modes During Plasma-assisted Molecular Beam Epitaxy of (0001) GaN," 2007, Applied Physics Letters, vol. 91, pp. 161904-1-161904-3.

Manfra et al., "Dislocation and Morphology Control During Molecular-Beam Epitaxy of AlGaN/GaN Heterostructures Directly on Sapphire Substrates," 2002, Applied Physics Letters, vol. 81, pp. 1456-1458.

Marchand et al., "Microscructure of GaN Laterally Overgrown by Metalorganic Chemical Vapor Deposition", 1998, Applied Physics Letters, vol. 73, No. 6, pp. 747-749.

Nakamura, et al., "GaN Growth Using GaN Buffer Layer," 1991, Japanese Journal of Applied Physics, vol. 30, No. 10A, pp. L 170S-L 1707.

Park et al., "Selective-area and Lateral Epitaxial Overgrowth of III-N Materials by Metal Organic Chemical Vapor Deposition," 1998, Applied Physics Letters, vol. 73, No. 3, pp. 333-335.

Romanov et al., "Stress Relaxation in Mismatched Layers Due to Threading Dislocation Inclination" 2003, Applied Physics Letter, vol. 83, No. 13, pp. 2569-2571.

Stutzmann et al., "Playing with Polarity," 2001, Physics Status Solidi, vol. B-228, No. 2, pp. 505-512.

Sumiya et al., "Review of Polarity Determination and Control of GaN," 2004, MRS Internet Journal Nitride Semiconductor Research, vol. 9, No. 1, pp. 1-34.

Sumiya et al., "Growth Mode and Surface Morphology of a GaN Film Deposited Along the N-face Polar Direction on c-plane Sapphire Substrate," 2000, Journal of Applied Physics, vol. 88, No. 2, pp. 1158-1165.

Waltereit et al., "Structural Properties of GaN Buffer Layers on 4H—SiC (OOOI) Grown by Plasma-Assisted Molecular Beam Epitaxy for High Electron Mobilty Transistors," 2004, Japanese Journal of Applied Physics, vol. 43, No. 12-A, pp. L1520-L1523.

Weyher et al., "Morphological and Structural Characteristics of Homoepitaxial GaN Grown by Metalorganic Chemical Vapour Deposition (MOCVD)," 1999, Journal of Crystal Growth, vol. 204, pp. 419-428.

Xu et al., "Polarity Control of GaN Grown on Sapphire Substrate by RF-MBE," 2002, Journal of Crystal Growth, vol. 237-239, Part 2, pp. 1003-1007.

Choi et al., '2.51 microcavity InGaN light-emitting diodes fabricated by a selective dry-etch thinning process', Applied Physics Letters, 2007, 91(6), 061120.

Fukuda et al., 'Prospects for the Ammonothermal Growth of Large GaN Crystal,' Journal of Crystal Growth, vol. 305, 2007, pp. 304-310.

Iso et al., 'High Brightness Blue InGaN/GaN Light Emitting Diode on Nonpolar m-Plane Bulk GaN Substrate,' Japanese Journal of Applied Physics, 2007, vol. 46, No. 40, pp. L960-L962.

Lide et al., 'Thermal Conductivity of Ceramics and Other Insulating Materials,' CRC Handbook of Chemistry and Physics, 91st Edition, 2010-2011, pp. 12-203 and 12-204.

http://www.matbase.com/material/non-ferrous-metals/other/molybdenum/properties, Data Table for: Non-Ferrous Metals: Other Metals: Molybdenum, Mar. 28, 2011, pp. 1.

Pattison et al., 'Gallium Nitride Based Microcavity Light Emitting Diodes With 2λ Effective Cavity Thickness', Applied Physics Letters, vol. 90, Issue 3, 031111 (2007) 3pg.

Sarva et al., 'Dynamic Compressive Strength of Silicon Carbide Under Uniaxial Compression,' Material Sciences and Engineering, vol. A317, 2001, pp. 140-144.

Tyagi et al., 'Semipolar (1011) InGaN/GaN Laser Diodes on Bulk GaN Substrates,' Japanese Journal of Applied Physics, vol. 46, No. 19, 2007, pp. L444-L445.

Weisbuch et al., 'Recent results and latest views on microcavity LEDs', Light-Emitting Diodes: Research, Manufacturing, and Applications VIII, ed. by S.A. Stockman et al., Proc. SPIE, vol. 5366, p. 1-19 (2004).

USPTO Office Action for U.S. Appl. No. 12/133,364 dated Nov. 26, 2010.

USPTO Office Action for U.S. Appl. No. 12/133,364 dated Jun. 1, 2011.

USPTO Notice of Allowance for U.S. Appl. No. 12/133,364 dated Oct. 11, 2011.

USPTO Office Action for U.S. Appl. No. 12/133,365 dated Jun. 9, 2011.

USPTO Office Action for U.S. Appl. No. 12/133,365 dated Oct. 18, 2011.

USPTO Office Action for U.S. Appl. No. 12/334,418 dated Apr. 5, 2011.

USPTO Office Action for U.S. Appl. No. 12/334,418 dated Oct. 19, 2011.

USPTO Office Action for U.S. Appl. No. 12/478,736 dated Sep. 27, 2011.

USPTO Office Action for U.S. Appl. No. 12/478,736 dated Feb. 7, 2012.

USPTO Notice of Allowance for U.S. Appl. No. 12/478,736 dated Apr. 23, 2012.

USPTO Notice of Allowance for U.S. Appl. No. 12/478,736 dated Oct. 9, 2012.

USPTO Office Action for U.S. Appl. No. 12/484,095 dated Nov. 10, 2010.

USPTO Office Action for U.S. Appl. No. 12/484,095 dated Jul. 8, 2011.

USPTO Office Action for U.S. Appl. No. 12/497,969 dated Feb. 2, 2012.

USPTO Office Action for U.S. Appl. No. 12/497,969 dated Jul. 5, 2012.

USPTO Office Action for U.S. Appl. No. 12/534,838 dated May 3, 2011.
USPTO Office Action for U.S. Appl. No. 12/534,838 dated Jan. 13, 2012.
USPTO Office Action for U.S. Appl. No. 12/534,838 dated Mar. 20, 2012.
USPTO Notice of Allowance for U.S. Appl. No. 12/534,838 dated Jun. 8, 2012.
USPTO Office Action for U.S. Appl. No. 12/534,843 dated Sep. 10, 2012.
USPTO Office Action for U.S. Appl. No. 12/534,844 dated Sep. 16, 2010.
USPTO Office Action for U.S. Appl. No. 12/534,844 dated Feb. 4, 2011.
USPTO Notice of Allowance for U.S. Appl. No. 12/534,849 dated Jul. 31, 2012.
USPTO Office Action for U.S. Appl. No. 12/534,857 dated Sep. 1, 2010.
USPTO Notice of Allowance for U.S. Appl. No. 12/534,857 dated May 27, 2011.
USPTO Office Action for U.S. Appl. No. 12/546,458 dated Jul. 20, 2011.
USPTO Notice of Allowance for U.S. Appl. No. 12/546,458 dated Nov. 28, 2011.
USPTO Office Action for U.S. Appl. No. 12/556,562 dated Sep. 15, 2010.
USPTO Office Action for U.S. Appl. No. 12/556,562 dated Mar. 21, 2011.
USPTO Notice of Allowance for U.S. Appl. No. 12/556,562 dated Jul. 27, 2011.
USPTO Office Action for U.S. Appl. No. 12/569,337 dated May 9, 2012.
USPTO Notice of Allowance for U.S. Appl. No. 12/569,337 dated Nov. 15, 2012.
USPTO Office Action for U.S. Appl. No. 12/569,841 dated Dec. 23, 2011.
USPTO Office Action for U.S. Appl. No. 12/569,844 dated Oct. 12, 2012.
USPTO Office Action for U.S. Appl. No. 12/634,665 dated Apr. 25, 2012.
USPTO Office Action for U.S. Appl. No. 12/634,665 dated Oct. 1, 2012.
USPTO Office Action for U.S. Appl. No. 12/724,983 dated Mar. 5, 2012.
USPTO Notice of Allowance for U.S. Appl. No. 12/754,886 dated May 17, 2012.
USPTO Notice of Allowance for U.S. Appl. No. 12/754,886 dated Jun. 5, 2012.
USPTO Notice of Allowance for U.S. Appl. No. 12/754,886 dated Jun. 20, 2012.
USPTO Office Action for U.S. Appl. No. 12/785,404 dated Mar. 6, 2012.
USPTO Notice of Allowance for U.S. Appl. No. 12/785,404 dated Jul. 16, 2012.
USPTO Office Action for U.S. Appl. No. 12/891,668 dated Sep. 25, 2012.
USPTO Office Action for U.S. Appl. No. 13/025,833 dated Jul. 12, 2012.
USPTO Office Action for U.S. Appl. No. 13/041,199 dated Nov. 30, 2012.
USPTO Office Action for U.S. Appl. No. 13/179,346 dated Aug. 17, 2012.
USPTO Office Action for U.S. Appl. No. 13/179,346 dated Dec. 13, 2012.
USPTO Office Action for U.S. Appl. No. 13/226,249 dated Oct. 10, 2012.
USPTO Notice of Allowance for U.S. Appl. No. 13/425,304 dated Aug. 22, 2012.

* cited by examiner

US 8,465,588 B2

AMMONOTHERMAL METHOD FOR GROWTH OF BULK GALLIUM NITRIDE

CROSS-REFERENCE TO RELATED APPLICATIONS

This application is a continuation of U.S. application Ser. No. 12/556,558 filed Sep. 9, 2009; which application claimed priority from U.S. Provisional Application No. 61/096,304 filed Sep. 11, 2008; and U.S. Provisional Application No. 61/178,460 filed May 14, 2009, commonly assigned, each of which is incorporated by reference in their entirety herein. This application is related to U.S. patent application Ser. No. 12/556,562 filed Sep. 9, 2009, commonly assigned, and which is incorporated by reference in its entirety herein.

BACKGROUND OF THE INVENTION

The present invention relates generally to crystalline materials. More particularly, the present invention provides a seed crystal and method using back and front side deposition of crystalline materials, e.g., GaN, AlN, InN. In a specific embodiment, the seed crystals can be used in an ammonothermal growth process or the like. Merely by way of example, the present substrate materials can be used in applications such as such as light emitting diodes, integrated circuits, MEMS, medical devices, combination of these, among others.

Single-crystal gallium nitride (GaN) containing compounds and related alloy compounds containing aluminum and indium (AlN, $Al_xGa_{1-x}N$, InN, $In_xGa_{1-x}N$) are useful semiconducting materials. Such semiconductor materials can be useful for a variety of applications due to their large bandgap and high chemical and thermal stability. In recent years there has been significant technological advancement in electronic and optoelectronic devices based on these materials, such as transistors, solar cells, light-emitting diodes, and lasers, among others. Although some of these products are available in the commercial market today, lack of a suitable GaN substrate on which to grow these materials remains a limitation to both performance and providing low cost, volume production of devices.

Conventional approaches to growth of GaN, AlN or InN containing compounds (collectively referred to as "(Al,In)GaN" compounds) and devices employ foreign substrate materials (containing one or more primary chemical species which is different from Ga, Al, In, or N), a process known as "heteroepitaxy". Heteroepitaxial approaches to growth of (Al,In)GaN containing compounds result in epitaxial films with high defect densities due to the large lattice mismatch, chemical dissimilarity and thermal expansion coefficient difference between the nitride materials and substrate. The presence of defects is well-known to be detrimental to device performance. The thermal expansion coefficient difference between the substrate and the epitaxial layer in heteroepitaxy results in strain gradients in the material which can lead to wafer curvature, referred to as bow or warp, after growth. As used herein, the terms bow and warp are used in a manner which is well understood in this art. Definitions, for example, can be found from SEMI (www.semi.org), but can be others commonly known. There is therefore a need for bulk GaN substrates of high crystalline quality, ideally cut from large volume bulk GaN ingots.

Ammonothermal growth is a promising low cost and potentially highly scalable approach to produce such a GaN ingot. Ammonothermal growth has provided high quality crystalline material. Unfortunately, drawbacks exist. As an example, ammonothermal growth techniques lead to small sized crystals, which are often not useful for commercial applications. Additionally, defects in the seed material used for ammonothermal growth often replicate on any grown crystal structures. These and other limitations often exist with conventional ammonothermal techniques.

From the above, it is seen that techniques for improving crystal growth are highly desired.

BRIEF SUMMARY OF THE INVENTION

According to the present invention, techniques for manufacture of crystalline materials are described. More particularly, the present invention provides a seed crystal and method using back and front side deposition of crystalline materials, e.g., GaN, AlN, InN. In a specific embodiment, the seed crystals can be used in an ammonothermal growth process or the like. Merely by way of example, the present substrate materials can be used in applications such as such as light emitting diodes, integrated circuits, MEMS, medical devices, combination of these, among others.

In a specific embodiment, the present invention provides a high quality gallium containing seed crystal having a large area that is substantially flat and free of bowing and/or bending. Of course, there can be other variations, modifications, and alternatives.

In a specific embodiment, the present invention provides a method for fabricating crystalline material, e.g., GaN. The method includes providing a crystalline substrate material having a first surface and a second surface. The method maintains the crystalline substrate material by engaging the second surface while exposing the first surface. In a specific embodiment, the method includes forming a first thickness of first crystalline material overlying the first surface of the crystalline substrate material. In a preferred embodiment, the first thickness of first crystalline material has a first orientation. In a specific embodiment, the method also includes providing the crystalline substrate material having the overlying first crystalline material and exposing the second surface of the crystalline substrate material. The method includes forming a second thickness of second crystalline material overlying the second surface of the crystalline substrate material such that the second thickness of second crystalline material has substantially a same thickness as the first thickness of first crystalline material. In a specific embodiment, the first thickness and second thickness comprise substantially similar composition. In this embodiment a substantially similar composition refers to the lattice constants of the primary constituent material within the first thickness and the primary constituent material within the second thickness being within about 0.01 Å. In another embodiment, the compositions of the first crystalline material and the second crystalline material are different but the lattice constant of the two materials are substantially the same being with about 0.05 Å of each other. In a preferred embodiment, the second thickness of second crystalline material has a second orientation. In a specific embodiment, both the first thickness and second thickness have epitaxial relationships with the crystalline substrate material.

One or more benefits may be achieved using one or more of the specific embodiments. As an example, the present device and method provides a substantially flat and large area seed crystal having high quality suitable for an ammonothermal or like process of crystal growth. In a specific embodiment, the present method and device can be made using conventional techniques and is cost effective. Depending upon the embodiment, one or more of these benefits can be achieved. These and other benefits are further described throughout the present specification and more particularly below.

DETAILED DESCRIPTION OF THE INVENTION

Figure 1:
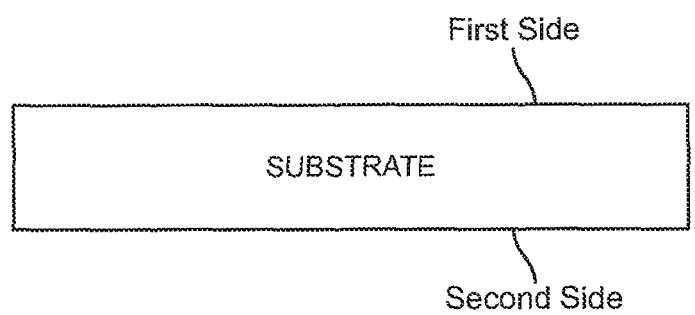
FIG. 1 is a simplified diagram of a crystalline substrate material with a first side and a second side according to an embodiment of the present invention.

According to the present invention, techniques for manufacture of crystalline materials are provided. More particularly, the present invention provides a seed crystal and method using back and front side deposition of crystalline materials, e.g., GaN, AN, InN, $(Al_xB_yIn_zGa_{1-x-y-z})N$. In a specific embodiment, the seed crystals can be used in an ammonothermal growth process or the like. Merely by way of example, the present materials can be used in applications such as such as light emitting diodes, integrated circuits, MEMS, medical devices, combination of these, among others.

According to a specific embodiment of the present invention, techniques are provided for manufacture of a seed crystal for ammonothermal growth of GaN which is large-area and is substantially free of bowing. Such a seed is obtained through double-sided deposition on both sides of a foreign substrate such as sapphire ($Al_2O_3$), silicon carbide (SiC), silicon, $Mg_2AlO_4$ spinel, $ZrB_2$, among others. Such substrate materials are commonly available with large area (2" or greater in diameter) according to a specific embodiment. In a specific embodiment, the layers deposited on both the front and back sides of the substrate have an epitaxial relationship to the substrate material. In another embodiment the layers deposited on both the front and back sides of the substrate are substantially similar in composition. For example, the lattice constants of the primary constituent material in each layer are within about 0.01 Å. In another embodiment, the layers deposited on both the front and back sides of the substrate have substantially similar lattice constants but not necessarily similar compositions. For example, the primary constituent material on one side of the substrate is a GaN layer and the primary constituent material on the other side of the substrate is a $(Al_xB_yIn_zGa_{1-x-y-z})N$ layer with a substantially similar lattice constant, typically within 0.05 Å. The substrate is suitable for epitaxy (i.e. polished) on both sides of the wafer, for example by chemical mechanical polishing and other treatment processes. According to a specific embodiment, growth could occur by any form of molecular beam epitaxy (MBE), metal-organic chemical vapor deposition (MOCVD), hydride vapor phase epitaxy (HVPE) or other suitable techniques for thin film growth of nitride materials including but not limited to liquid phase epitaxy (LPE), laser ablation, among others, for example. These deposition techniques, in particular MOCVD and MBE, can be used for deposition of (Al,B,In)GaN containing layers. In a specific embodiment, at least one technique can be used to reduce threading dislocation densities. One such technique which is well known in GaN epitaxy is lateral epitaxial overgrowth (LEO) (See for example, J. Park, P. A. Grudowski, C. J. Eiting, and R. D. Dupuis, "Selective-area and lateral epitaxial overgrowth of III-N materials by metal organic chemical vapor deposition", Appl. Phys. Lett. 73, 333 (1998), and H. Marchand, X. H. Wu, J. P. Ibbetson, P. T. Fini, P. Kozoodoy, S. Keller, J. S. Speck, S. P. DenBaars, and U. K. Mishra, "Microscructure of GaN laterally overgrown by metalorganic chemical vapor deposition", Appl. Phys. Lett. 73, 747 (1998)). Another technique is SiN nanomasking, in which an in-situ layer of SiN is deposited which is porous on a nanometer scale, providing defect reduction uniformly across the wafer in a similar fashion to LEO but without external processing steps (See for example, A. Chakraborty, K. C. Kim, F. Wu, J. S. Speck, S. P. DenBaars, and U. K. Mishra, "Defect reduction in a nonpolar a-plane GaN films using in situ $SiN_x$ nanomask", Appl. Phys. Lett. 89, 041903 (2006)). Another technique is known as cantilever epitaxy, where a pattern is etched into the substrate material prior to deposition with appropriate dimensions such that lateral growth from the unetched plateaus is achieved (See for example, T. M. Katona, M. D. Craven, P. T. Fini, J. S. Speck, and S. P. DenBaars, "Observation of crystallographic wing tilt in cantilever epitaxy of GaN on silicon carbide and silicon (111) substrates", Applied Physics Letters 79, 2907 (2001)).

Additionally as background to the present invention, we discovered that the resulting crystalline quality using ammonothermal growth depends directly on having a high quality GaN seed crystal for growth. We also believe that the seed is preferably large-area in order to accommodate eventual wafering into large-area substrates for device fabrication. Additionally, seed crystals of GaN for ammonothermal growth can be obtained in various ways. As low dislocation densities are desired, one approach to producing thick GaN layers or bulk GaN (via substrate removal after heteroepitaxial growth) for ammonothermal seed is by hydride vapor phase epitaxy (HVPE). However, HVPE films commonly contain dislocation densities on the order of $\sim 10^{10}$ cm$^{-2}$ at the onset of growth. These can drop by several orders of magnitude (to $\sim 10^6$-$10^7$ cm$^{-2}$) after hundreds of microns of growth, however grain and tilt boundaries may be present and surfaces can be faceted. In addition, thermal mismatch between the HVPE-grown layer and the substrate induces strain gradients in the material which result in bowing upon cooldown. Additionally, inclination of threading dislocations can result in strain gradients (See for example, A. E. Romanov and J. S. Speck, Appl. Phys. Lett. 83, 2569 (2003), and P. Cantu, F. Wu, P. Waltereit, S. Keller, A. E. Romanov, U. K. Mishra, S. P. DenBaars, and J. S. Spec, Appl. Phys. Lett. 83, 674 (2003)). Bowing persists in the HVPE-GaN seed crystal even after subsequent substrate removal (most notably from strain gradients due to threading dislocation inclination), and thus, would persist in ammonothermally grown GaN if this material is used as a seed. These and other limitations are overcome by one or more of the techniques described throughout the present specification and more particularly below.

Figure 2:
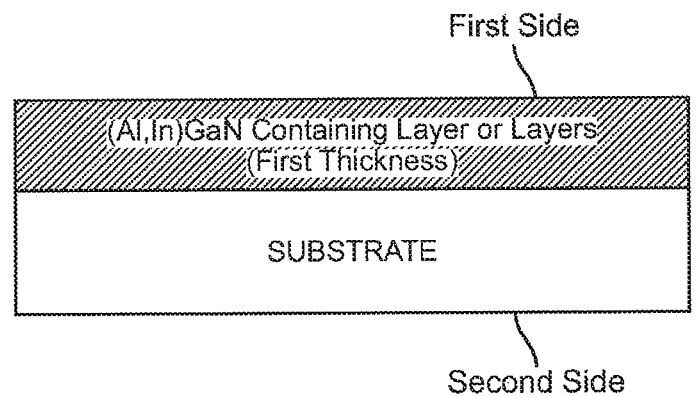
FIG. 2 is a simplified diagram illustrating a first thickness of (Al,In)GaN containing material on a first side of a crystalline substrate material formed by a growth method at elevated temperature, and illustrated at elevated temperature, according to an embodiment of the present invention.
Figure 3:
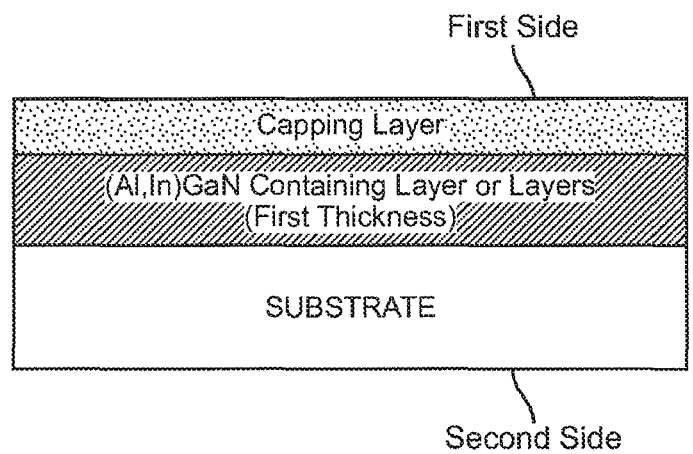
FIG. 3 is a simplified diagram illustrating a capping layer overlying a first thickness of (Al,In)GaN containing material on a first side of a crystalline substrate material, illustrated at elevated temperature, according to an embodiment of the present invention.
Figure 4:
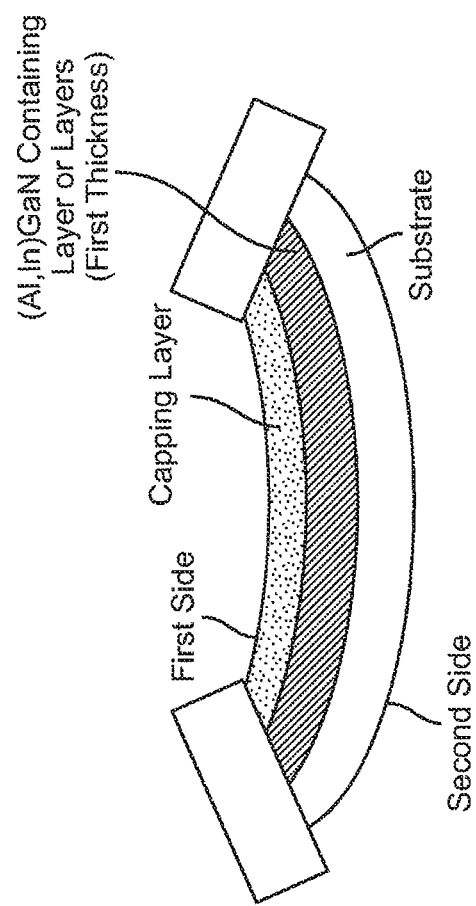
FIG. 4 is a simplified diagram illustrating a capping layer overlying a first thickness of (Al,In)GaN containing material on a first side of a crystalline substrate material, after being cooled from elevated temperature to room temperature, according to an embodiment of the present invention. The wafer exhibits curvature known as bow, bend or warp. Dimensions of wafer curvature are exaggerated for illustration.
Figure 5:
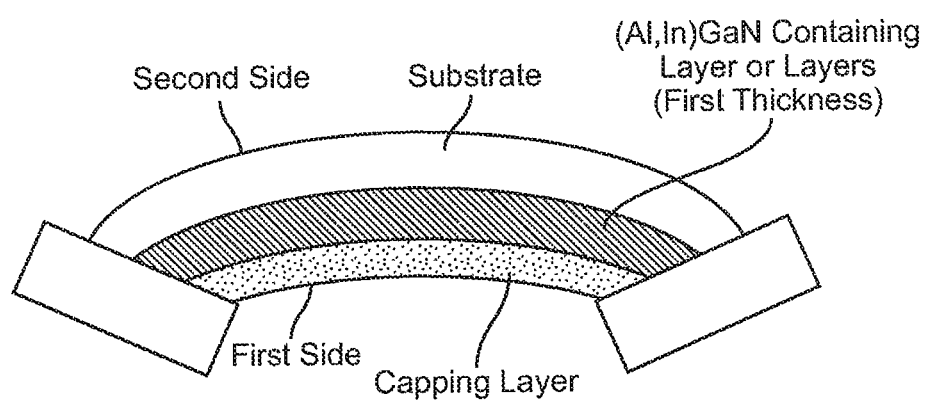
FIG. 5 is a simplified diagram illustrating reorienting a crystalline substrate material and overlying layers from a first side to a second side according to an embodiment of the present invention.
Figure 6:
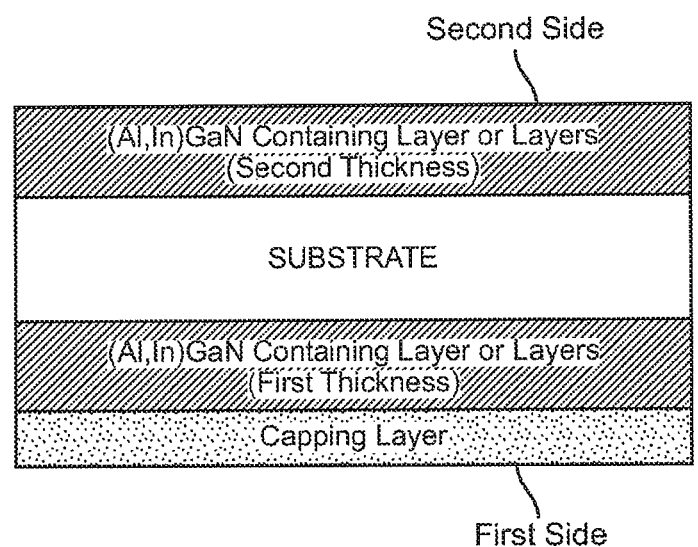
FIG. 6 is a simplified diagram illustrating a second thickness of (Al,In)GaN containing material deposited on a second side of a crystalline substrate material, formed by a growth method at elevated temperature and illustrated at elevated temperature, according to an embodiment of the present invention.
Figure 7:
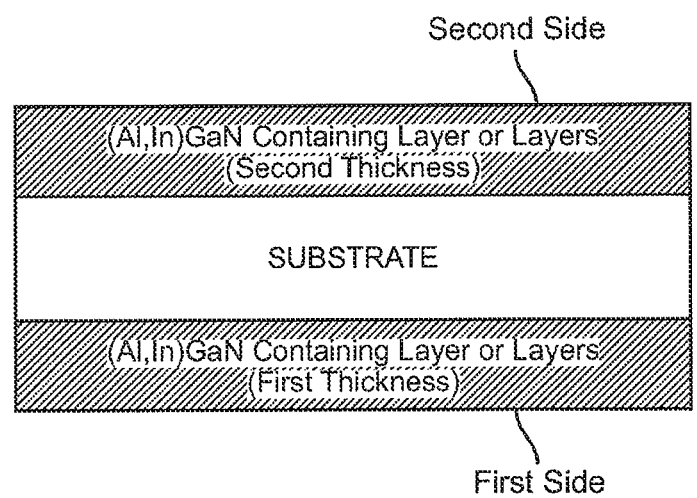
FIG. 7 is a simplified diagram of a double-sided seed crystal which is substantially free of bow, bend or warp, illustrated post-growth and after removal of the capping layer from the first side, according to an embodiment of the present invention.

In a specific embodiment as referred to in the Figures, the present invention includes a method for fabricating such a seed crystal utilizing double-sided growth:

1. Begin;
2. Provide a crystalline substrate material having a first and second side which are both suitable for epitaxial growth of (Al,B,In,Ga)N containing compounds (i.e. double-side polished), see FIG. 1;
3. Optionally, prepare (e.g., clean, degrease) the crystalline substrate material for a (Al,B,In,Ga)N growth technique;
4. Optionally, form dielectric and/or metal on the second side of the crystalline substrate material;
5. Transfer crystalline substrate material into a growth chamber, e.g., MOCVD;
6. Deposit (under desired thermal conditions) an (Al,B,In,Ga)N layer overlying the first side of the substrate using a nitride growth technique, see FIG. 2;
7. Optionally, deposit a mask or capping layer over the (Al,B,In,Ga)N layer on the first side of the substrate, see FIG. 3, (which may be in a separate chamber or use a separate and distinct process);
8. Obtain a resulting substrate material having a bow, bend, or warp therein, see FIG. 4;
9. Reorient substrate to expose second side including optional dielectric and/or metal layer, see FIG. 5;
10. Selectively remove dielectric and/or metal layer from the second side of the crystalline substrate material using an etching process if the crystalline substrate material has a dielectric and/or metal layer on the second side;
11. Optionally, prepare the substrate material with the overlying nitride layer for nitride growth on the second side of the crystalline substrate material using a (Al,B,In,Ga)N growth technique;
12. Optionally, deposit an additional layer, possibly a metal layer, on the capping layer overlying the first side of the substrate;
13. Deposit (under desired thermal conditions) a second thickness of an (Al,B,In,Ga)N layer (as in step 6), with a substantially similar lattice constant to the first (Al,B,In,Ga)N layer, overlying the second side of the crystalline substrate material, see FIG. 6;
14. Cool substrate and remove from growth chamber a substantially flattened wafer having deposited films on each side of the crystalline substrate material, see FIG. 7;
15. Selectively remove the additional layer, possibly a metal layer, from the first side of the wafer using an etching process if the wafer has an additional layer on the first side;
16. Remove capping layer from first side of crystalline substrate material if a capping layer is present on the first side;
17. Output wafer having double-sided deposition of films, see FIG. 7;
18. If needed, coat sidewalls to encapsulate exposed crystalline substrate material; and
19. Perform other steps, as desired.

The above sequence of steps provides a fabrication method for forming a seed crystal according to an embodiment of the present invention. In a specific embodiment, the present invention provides a method and device for forming a seed crystal containing a gallium containing species using a double-sided deposition process. Other alternatives can also be provided where steps are added, one or more steps are removed, one or more steps are modified or performed differently, or one or more steps are provided in a different sequence without departing from the scope of the claims herein. Of course, there can be other variations, modifications, and alternatives.

In a specific embodiment, during deposition on the first ("front") side of the substrate at the growth temperature, with or without employing defect reduction techniques, the wafer is flat and free of bowing. Upon cooling after growth, bowing can be present due to the difference in thermal expansion coefficients of the grown nitride containing layer(s) and the substrate. The second step is an identical deposition on the second ("back") side of the substrate. At the growth temperature, and during deposition of the second nitride containing layer, the wafer is again flat and free of bowing. Upon cooldown, which takes the substrate back to room temperature, with nominally identical material layers on both sides of the substrate, the strain gradients in opposite directions would be substantially balanced, thus eliminating or greatly reducing the bowing and retaining a substantially flat wafer. In order to realize growth on the second ("back") side of the wafer without causing the GaN on the front side to decompose under thermal conditions during growth, a mask or capping layer may be employed. The capping layer could consist of AlN, SiN, $Si_3N_4$, $SiO_2$, TaO, metals such as Ti, Ta, Mo, Ag, Au, W, or Pt, silicides or nitrides of these metals, among others, and could be deposited in-situ or ex-situ. The capping layer should be stable in the GaN growth environment and able to be subsequently removed with minimal interaction with the underlying material. This capping layer is deposited on the front side of the substrate overlying the first nitride deposition. This capping layer could be deposited by e-beam evaporation, sputtering, chemical vapor deposition, or other deposition techniques.

In a specific embodiment, the wafer is turned over and identical growth is performed on the back side of the wafer. The resulting wafer can be large-area due to the possibility of using common large-area substrates for epitaxy (for example circular sapphire substrates are available with 2-8" diameter and can be utilized for deposition of nitride containing materials by the aforementioned techniques). The substrates used could be circular, square, rectangular or other arbitrary shape. In preferred embodiments, the wafer is circular as this shape could mitigate delamination effects (the separation of the grown nitride containing layer from the substrate) after growth. Delamination can occur due to higher thermal mismatch stresses in the deposited films at the edges of the wafer as compared to the center. A possible way to mitigate these stress effects is to maximize the area-to-perimeter ratio of the substrate. The area-to-perimeter ratio will be largest in a circular substrate geometry, and smaller in square, rectangular, or other arbitrary geometries, for example. If non-circular substrate geometries are used, the stress is higher at corners relative to the edges. In this case the corners of the substrate could be rounded by machining such as grinding to mitigate these effects. In all cases, the resulting wafer with double-sided growth of nitride containing films will be of sufficiently high crystalline quality due to growth techniques which are known in the art for nitride thin films. For c-plane-oriented GaN, for example, full-width at half-maximum (FWHM) values from high-resolution x-ray diffraction omega rocking curve scans across the (002) and (201) reflections could be <0.1 degrees and <0.3 degrees, respectively.

Nitride containing wurtzite materials are commonly known as "polar" materials due to lack of inversion symmetry in the crystal structure. Such materials exhibit both spontaneous and strain-induced, or piezoelectric polarization along the c-axis, or [0001] axis. The c-direction, or direction, is a common growth direction for these materials, and is commonly known as the polar axis or polar growth direction. The net polarization and consequent internal electric fields in such materials are well known to influence electrical and optical properties and device performance. The polarity of these materials is commonly characterized as "Gallium-face" or "Gallium-polar" if the [0001] direction is the primary growth direction. The polarity of these materials is commonly characterized as "Nitrogen-face" or "Nitrogen-polar" if the [000-1] direction is the primary growth direction. In a specific embodiment of the present invention, the nitride containing material has an orientation within 10 degrees of (0001) or (000-1).

One approach for eliminating the spontaneous and piezoelectric polarization effects in nitride devices is to grow the devices on "nonpolar" planes of the crystal. Primary growth directions oriented at approximately 90 degrees to (0001) or (000-1) are known as "nonpolar" orientations of the material, as the polar axis is normal to the primary growth direction. Two such families of nonpolar planes for wurtzite nitride containing materials are {10-10}, known collectively as m-planes, or {11-20}, known collectively as a-planes. In a specific embodiment of the present invention, the nitride containing material has an orientation within 10 degree of (10-10) or (11-20) and their associated families of planes.

Primary growth orientations which are oriented at angles between 0 and 90 degrees of or [000-1] are known as "semipolar" orientations of the material. There are a wide variety of such semipolar planes, which can be defined as having both two nonzero h, i, or k Miller indices and a nonzero l Miller index. Families of such semipolar planes include {10-11} and {11-2l}, for example, where l is a nonzero integer. Specific examples of commonly observed semipolar planes in GaN include {11-22}, {10-11}, and {10-13}. Other examples in the wurtzite crystal structure include, but are not limited to, {10-12}, {20-21}, {11-21} and {10-14}. Semipolar materials exhibit polarity, although the net polarization vector lies at an angle inclined relative to the plane's surface normal rather than in-plane or normal to the plane. Semipolar materials are characterized as "Ga-polar" or having "Ga-face polarity" if the [0001] direction is oriented toward the film surface normal. Semipolar materials are characterized as "N-polar" or having "N-face polarity" if the [000-1] direction is oriented toward the film surface normal. In a specific embodiment of the present invention the nitride containing material has an orientation within 5 degrees of (10-11), (10-1-1), (10-12), (10-1-2), (10-13), (10-1-3), (11-21), (11-2-1), (20-21), (20-2-1), (10-14), (10-1-4), (11-22) or (11-2-2), along with their associated families of planes.

According to a preferred embodiment of the present invention, it is desirable that the resulting material have the same crystallographic orientation, and therefore the same polarity, on both sides of the substrate. Preferred embodiments could utilize substrates such as double-side polished sapphire, (111) Si, or (111) $Mg_2AlO_4$ spinel which would result in the same crystallographic orientation of nitride containing material on both sides.

Gallium face or Nitrogen face polarity can be realized with either growth technique depending on both the substrate and growth conditions. It has been established that using MOCVD, the polarity of a GaN film on c-plane sapphire is determined by the growth initiation procedures (See for example, E. S. Hellman, MRS Internet J. Nitride Semicond. Res. 3, 11 (1998) and references therein, M. Stutzmann, O. Ambacher, M. Eickhoff, U. Karrer, A. Lima Pimenta, R. Neuberger, J. Schalwig, R. Dimitrov, P. J. Schuck, and R. D. Grober, Phys. Status Solidi B 228 (2001) 505, M. Sumiya and S. Fuke, MRS Internet J. Nitride Semicond. Res. 9 (2004) 1, S. Keller, B. P. Keller, Y. F. Wu, B. Heying, D. Kapolnek, J. S. Speck, U. K. Mishra, and S. P. DenBaars, Appl. Phys. Lett. 68, (1996) 1525). A standard two-step process with growth initiated with a thin GaN or AlN layer at low temperatures, for example, has been shown to result in c-plane Ga-face films with high crystalline quality suitable for devices. (See for example, H. Amano, N. Sawaki, I. Akasaki, and Y. Toyoda, Appl. Phys. Lett. 48, 353 (1986), and S, Nakamura, Jpn. J. Appl. Phys., Part 2 30, L1705 (1991)). Nitridation of sapphire at high temperature prior to growth can result in formation of a thin AlN surface layer (See for example, N. Grandjean, J. Massies, and M. Lerous, Appl. Phys. Lett. 69, 2071 (1996)), and N-face films typically result. (See for example, P. Cantu, F. Wu, P. Waltereit, S. Keller, A. E. Romanov, U. K. Mishra, S. P. DenBaars, and J. S. Spec, Appl. Phys. Lett. 83, 674 (2003), and M. Stutzmann, O. Ambacher, M. Eickhoff, U. Karrer, A. Lima Pimenta, R. Neuberger, J. Schalwig, R. Dimitrov, P. J. Schuck, and R. D. Grober, Phys. Status Solidi B 228 (2001) 505). While N-face films by MOCVD have typically been of much poorer quality (high surface roughness and surfaces characterized by large hexagonal hillocks potentially due to inversion domains) (See for example, M. Sumiya, K. Yoshimura, T. Ito, K. Ohtsuka, S. Fuke, M. Mizuno, M. Yoshimoto, H. Koinuma, A. Ohtomo, and M. Kawasaki, J. Appl. Phys. 88, 1158 (2000), and J. L. Weyher, P. D. Brown, A. R. A. Zauner, S. Muller, C. B. Boothroyd, D. T. Foord, P. R. Hageman, C. J. Humphreys, P. K. Larsen, I. Grzegory, and S. Porowski, J. Cryst. Growth 204, 419 (1999)), it has been recently shown that high quality N-face GaN can be achieved using sapphire with higher degrees of miscut (See for example, S. Keller, N. Fichtenbaum, F. Wu, D. Brown, A. Rasales, S. P. DenBaars, J. S. Speck and U. K. Mishra, J. Appl. Phys. 102, 083546 (2007)). By MBE, for example, c-plane GaN with both polarities can also be achieved with varying growth conditions (See for example, S. K. Davidsson, M. F. Falth, X. Y. Liu, H. Zirath, and T. G. Andersson, J. Appl. Phys. 98, 016109 (2005) and K. Xu, N. Yano, A. W. Jia, A. Yoshikawa, and K k. Takahashi, J. Cryst. Growth 237-239, Part 2, 1003 (2002)). Use of the dopant Mg has also been shown to result in polarity inversion under specific growth conditions by MBE (See for example, D. S. Green, E. Haus, F. Wu, L. Chen, U. K. Mishra and J. S. Speck, J. Vac. Sci. Tech. B 21, 1804 (2003)). Various semipolar orientations have also been experimentally realized. For example, (10-1-1) GaN on (100) $MgAl_2O_4$ spinel and (10-13) GaN on (110) $MgAl_2O_4$ spinel have been realized utilizing HVPE (See for example, T. J. Baker, B. A. Haskell, F. Wu, J. S. Speck, and S, Nakamura, "Characterization of planar semipolar gallium nitride films on spinel substrates", Japanese Journal of Applied Physics 44, L920 (2005)), and (10-1-3) GaN on (1010) sapphire and (11-22) GaN on (10-10) sapphire (See for example, T. J. Baker, B. A. Haskell, F. Wu, J. S. Speck, and S, Nakamura, "Characterization of planar semipolar gallium nitride films on sapphire substrates", Japanese Journal of Applied Physics 45, L154 (2006)). Use of any of these techniques and substrates, or a combination of them, can be used to give the desired orientation and polarity of nitride material in the present invention.

Alternatively in a specific embodiment, the orientation and polarity of the resulting nitride layers on each side of the substrate will be different. An example is a substrate such as SiC, where one side of the wafer is terminated primarily by Si atoms and the other side primarily by C atoms. The polarity of the resulting nitride layers on either side will be different. The Si-terminated surface can often result in Ga-polar GaN films and the C-terminated surface can often result in N-polar GaN films, for example. In a specific embodiment wafer fusion could be used, for example, to bond two SiC wafers at their C-terminated sides resulting in two Si-terminated sides exposed for growth. In another embodiment a similar wafer fusion procedure could be used to fuse Si-terminated sides of two SiC wafers resulting in C-terminated sides exposed for growth. This would allow for the same polarity nitride film to be achieved on both sides of the substrate during the double-sided growth method described herein. This wafer fusion procedure could also be applied to crystalline substrate materials other than SiC, or to a combination of substrate materials. In another embodiment, nitride containing material of the same polarity could be formed on two separate crystalline substrates by separate processes and the backsides could be subsequently fused.

In some embodiments of the present invention, one or more layers possessing different compositions may be utilized but that possess similar lattice constants. For example, GaN could be grown on one side of the substrate and lattice-matched AlInN could be grown on the opposite side of the substrate. The compositions of the first crystalline material on the first side of the substrate and the second crystalline material on the second side of the substrate are different but the lattice constant of the two materials are substantially the same being with about 0.05 Å of each other.

In some embodiments of the present invention one or more layers possessing different compositions may be utilized on one or both sides of the substrate. For example, GaN may be grown on one side of the substrate and InN and AlN may be grown on the opposite side of the substrate. Or, AlN and GaN may be grown on one side of the substrate and AlGaN may be grown on the opposite side of the substrate. Or, AlN and GaN may be grown on one side of the substrate and AlGaN and InN may be grown on the opposite side of the substrate. In another embodiment, one or more compositional gradients could be utilized. The composition of the (Al,B,In,Ga)N containing material on one or both sides of the substrate could be changed over some or all of the thickness of the material. For example, on one or both sides of the substrate, AN could be deposited and then an AlGaN material could be deposited where the Ga composition increases until the AlGaN layer becomes a GaN layer. The compositional gradient can occur over any thickness. One or more different compositional gradients could be utilized on either side of the substrate. The compositional gradient approach could also be used in conjunction with the multiple layer approach. In any of these methods or a combination thereof, specific compositions, layer structures, compositional gradients and/or thicknesses may be chosen for each side of the substrate to produce a resulting wafer composed of (Al,B,In,Ga)N containing material on both sides which is characterized by flat surfaces and is substantially free from bowing. This does not require that the thicknesses of (Al,B,In,Ga)N containing material on both sides of the wafer be substantially similar. Instead, the coefficients of thermal expansion of both (Al,B,In,Ga)N containing materials could be engineered to be similar to produce a substantially flat wafer, for example. Or, the strain gradients in the crystalline material on each side of the substrate could be matched to produce a flat wafer.

With some of these methods or a combination thereof, both sides of a resulting wafer will be composed of c-plane (Al,B,In,Ga)N containing material which is of either Ga-face (Ga-face will be the convention used in this document to describe the crystallographic facet containing Group-III atoms) or N-face polarity and is characterized by flat surfaces and is free of bowing. In some other of these methods or a combination thereof, both sides of the resulting wafer will be composed of nonpolar, semipolar, and/or c-plane (Al,B,In,Ga)N containing material which is characterized by flat surfaces and is substantially free of bowing. This material is thus, preferential for use as a seed crystal for ammonothermal growth. The GaN layers on both sides could be in the range of 0.5-500 microns thick depending on the growth technique. In a specific embodiment the deposition on the first and second sides of the wafer could consist of multiple layers of nitride containing material, in addition to a nucleation layer. In this embodiment the layer structures on the first and second sides of the wafer would be substantially the same, possessing substantially similar lattice constants for each corresponding layer.

In some embodiments the sidewalls of the substrate may be exposed after deposition on both sides of the substrate. In a specific embodiment, the substrate used for fabrication of the seed crystal described in the present invention herein should therefore be stable in ammonothermal growth environments which can be acidic or basic in nature and at high temperatures and pressures. If it is not stable, to avoid decomposition of the exposed substrate sidewall area during ammonothermal growth, the sidewalls could be coated with an encapsulant coating which is stable in the ammonothermal growth environment such as silver, gold, platinum, nickel, chromium, vanadium, among others including alloys of these materials. For good adhesion to the exposed substrate, a thin layer of a reactive metal such as titanium could be used prior to the metal encapsulant deposition. These metals could be deposited by techniques such as e-beam evaporation or sputtering, for example.

Following is an example illustrative of the present invention. It should be understood that this is presented as an example only, and should not be considered as limiting the scope of this invention which would include other embodiments not shown. Of course, there are other variations, modifications, and alternatives.

EXAMPLE 1

In a specific embodiment, the substrate is c-plane-oriented sapphire, of any miscut orientation angle (i.e. within 10 degrees of (0001)). Both sides of the wafer are polished, for example with chemical-mechanical polishing, to provide atomically smooth surfaces suitable for epitaxy. In this embodiment molecular beam epitaxy (MBE) is the growth technique utilized to produce the nitride containing epitaxial layers. In this embodiment, one side of the wafer is first coated with a metal such as Ti or Pt, a refractory metal such as W, Mo, Ta, a silicide or nitride of one of these metals, among others, or any combination of these, in order to facilitate heat transfer to the substrate during MBE growth. The thickness of the metal containing layers could range in thickness from 0.5 to 2 microns but is not limited to this range. The metal containing layers can be deposited for example by e-beam evaporation, sputtering, chemical vapor deposition or a combination of these or other deposition techniques. The substrate is then typically de-greased in solvents such as, but not limited to, acetone, methanol and isopropanol, with or without use of an ultrasonic bath, and spin-dried or nitrogen blow-dried.

The sample is then mounted on a substrate holder with the metalized surface facing the direction of the heater during growth, and loaded into a chamber of the MBE system. The type of sample mounting and the configuration of the substrate holder will vary depending on the type and geometry of the MBE system being used. The substrate holder could include, but is not limited to, ceramic diffuser plates, backing wafers such as silicon, quartz, or sapphire, molybdenum, ceramic, or tungsten retaining rings, and molybdenum or tantalum faceplates, for example. In some cases the substrate could be indium-bonded to a carrier wafer. The substrate and holder should then be baked at high temperature (e.g. 100-800° C., but not limited to this range) prior to growth, in the growth chamber or preferably in a separate chamber, for ~1 hour or a sufficient amount of time to outgas water and other impurities from the surface. The outgassing can be monitored by the chamber pressure and potentially using a residual gas analyzer. In this embodiment, the growth chamber of the MBE system is equipped with a radio frequency plasma source, an ammonia gas injector, a combination of these, or another suitable source of active nitrogen for growth. It is possible but not necessary that the nitrogen source gas is further purified using a getter-filter prior to introduction to the growth chamber. Conventional Knudsen cells are available for group III sources. Pumping of any or all of the MBE system chambers can be achieved utilizing cryogenic pumps, turbo pumps, ion pumps, among others, or a combination of these.

After bake and transfer to the growth chamber if necessary, the substrate is heated to the growth temperature (typically 650-800 C), and appropriate constituent elements are introduced to the chamber to form a (Al,B,In,Ga)N layer or combination of (Al,B,In,Ga)N layers necessary to result in epitaxial growth on the substrate with a total thickness in the approximate range of 0.5-2 microns. Various growth conditions which result in high quality nitride containing films by molecular beam epitaxy are known in the art and demonstrated in literature (See for example, B. Heying, R. Averbeck, L. F. Chen, E. Haus, H. Riechert, and J. S. Speck, J. Appl. Phys. 88, 1855 (2000), G. Koblmuller, S. Fernandez-Gamido, E. Calleja, and J. S. Speck, Appl. Phys. Lett. 91, 161904 (2007), and G. Koblmuller, F. Wu, T. Mates, J. S. Speck, S. Fernandez-Gamido, and E. Calleja, Appl. Phys. Lett. 91, 221905 (2007)). An AlN nucleation layer could or could not be used, and varying Group III/Group V flux ratios are utilized throughout growth. A two-step process comprising a low III/V ratio in the first GaN growth step and a high III/V ratio in the second GaN growth step has been shown to control dislocation density and result in high quality films on both sapphire and silicon carbide substrates, for example (See for example, M. J. Manfra, N. G. Weimann, J. W. P. Hsu, L. N. Pfeiffer, and K. W. West, Appl. Phys. Lett. 81, 1456 (2002), and P. Waltereit, C. Poblenz, S. Rajan, F. Wu, U. K. Mishra, J. S. Speck, Japanese Journal of Applied Physics 43, L1520 (2004)). A method for using ammonia as a nitrogen source to produce high quality MBE GaN layers has also been shown, for example, see A. L. Carrion, C. Poblenz, F. Wu, and J. S. Speck, J. Appl. Phys. 103, 093529 (2008). The miscut angle of the substrate is not known to influence the polarity of the film, although could influence crystal quality. It is possible that dopants could be intentionally incorporated in the epitaxial layers. A typical n-type dopant is Si, a typical p-type dopant is Mg, and typical compensating dopants are Be or C, for example. Under certain conditions Mg doping can result in polarity inversion (See for example, K. Xu, N. Yano, A. W. Jia, A. Yoshikawa, and K. Takahashi, J. Cryst. Growth 237-239, Part 2, 1003 (2002)). If Mg doping is utilized the appropriate conditions should be utilized to control polarity.

After MBE growth, the sample is removed from the chamber. The metal containing layer on backside of the substrate is then removed by wet etching in hydrofluoric acid, hydrochloric acid, nitric acid, sulfuric acid, among others, or a combination of these. The metal containing layer could also be removed by dry etching techniques such as RIE. The substrate is then rinsed in de-ionized water and dried with nitrogen. A second metal containing layer, identical to what was just removed, is then deposited on the front side of the substrate, overlying the grown nitride-containing material. This layer will be utilized for heat transfer during the next growth step. To prevent metal diffusion into the GaN at the growth temperature, a two-layer mask or cap could be deposited where the first layer could be AN, SiN, $SiO_2$, TaO, among others, and the second layer could be the metal, for example.

The sample is now re-introduced into the MBE chamber and the same steps are performed as just described, but with the sample being mounted in the chamber with the opposite side facing for growth. An identical epitaxial layer is deposited. After growth, the mask or cap layer(s) are removed by dry etching or wet etching.

Following is an example illustrative of the present invention. It should be understood that this is presented as an example only, and should not be considered as limiting the scope of this invention which would include other embodiments not shown. Of course, there are other variations, modifications, and alternatives.

EXAMPLE 2

In another embodiment the substrate is c-plane-oriented sapphire, of any miscut orientation angle (i.e. within 10 degrees of (0001)). Both sides of the wafer are polished, for example with chemical-mechanical polishing, to provide atomically smooth surfaces suitable for epitaxy. In this embodiment metal organic chemical vapor deposition (MOCVD) is the growth technique utilized to produce the nitride containing epitaxial layers. In this embodiment the substrate could be cleaned with organic solvents such as, but not limited to, acetone, methanol and isopropanol, with or without use of an ultrasonic bath. The sample should be spin-dried or blown dry with nitrogen and introduced into the MOCVD growth chamber. Preparation for growth could include pre-baking and annealing in $H_2$, for example >1000° C. Metalorganic sources such as trimethylgallium (TMGa), triethylgallium (TEGa), trimethylaluminum (TMAl), or trimethylindium ($TMIn_2$) with $H_2$ or $N_2$ carrier gas may be used with $NH_3$ as precursors to deliver constituent elements to the growth surface. A nitride containing layer with approximate thickness 0.5-10 microns is grown on the first side of the substrate using techniques which have been demonstrated for growth of high quality Ga-polar or N-polar films.[4-9,11-13] (See for example, T. M. Katona, M. D. Craven, P. T. Fini, J. S. Speck, and S. P. DenBaars, "Observation of crystallographic wing tilt in cantilever epitaxy of GaN on silicon carbide and silicon (111) substrates", Applied Physics Letters 79, 2907 (2001), A. E. Romanov and J. S. Speck, Appl. Phys. Lett. 83, 2569 (2003), P. Cantu, F. Wu, P. Waltereit, S. Keller, A. E. Romanov, U. K. Mishra, S. P. DenBaars, and J. S. Spec, Appl. Phys. Lett. 83, 674 (2003), E. S. Hellman, MRS Internet J. Nitride Semicond. Res. 3, 11 (1998) and references therein, M. Stutzmann, O. Ambacher, M. Eickhoff, U. Karrer, A. Lima Pimenta, R. Neuberger, J. Schalwig, R. Dimitrov, P. J. Schuck, and R. D. Grober, Phys. Status Solidi B 228 (2001) 505, M. Sumiya and S. Fuke, MRS Internet J. Nitride Semicond. Res. 9 (2004) 1, H. Amano, N. Sawaki, I. Akasaki, and Y. Toyoda, Appl. Phys. Lett. 48, 353 (1986), S, Nakamura, Jpn. J. Appl. Phys., Part 2 30, L1705 (1991), and N. Grandjean, J. Massies, and M. Lerous, Appl. Phys. Lett. 69, 2071 (1996)). An aluminum nitride (AlN) containing buffer layer or GaN buffer layer may or may not be used and growth could occur at either atmospheric pressure or lower pressures. A mask or capping layer such as SiN, $SiO_2$, TaO, among others, should be deposited after growth either in-situ or ex-situ. Such as mask or capping layer should be stable under GaN growth conditions and be able to be subsequently removed without damaging or reacting with the underlying nitride material. The sample is re-introduced into the MOCVD chamber and identical growth procedure is performed on the backside of the wafer. At the growth temperature and after cooldown, the double-sided wafer is free of bowing. After the double-sided wafer is removed from the growth chamber, the capping layer is etched off using dry or wet etching techniques.

Following is an example illustrative of the present invention. It should be understood that this is presented as an example only, and should not be considered as limiting the scope of this invention which would include other embodiments not shown. Of course, there are other variations, modifications, and alternatives.

EXAMPLE 3

Preparation of a Seed Crystal

An approximately 4 μm thick GaN layer is epitaxially grown by metalorganic chemical vapor deposition (MOCVD) on one side of a 2 inch, c-plane, double-side polished sapphire wafer. The wafer is then flipped over and placed back in an MOCVD reactor. An approximately 4 μm thick GaN layer is epitaxially grown on the remaining exposed sapphire surface, producing a sapphire wafer with a 4 μm thick GaN layer on each side of the sapphire wafer.

Following is an example illustrative of the present invention. It should be understood that this is presented as an example only, and should not be considered as limiting the scope of this invention which would include other embodiments not shown. Of course, there are other variations, modifications, and alternatives.

EXAMPLE 4

Preparation of a Seed Crystal

An approximately 4 μm thick GaN layer is epitaxially grown by MOCVD on one side of a 2 inch, c-plane, double-side polished sapphire wafer. The GaN layer is then annealed in a box furnace at 700° C. for 30 minutes to remove hydrogen from the GaN layer. A 200 Å thick layer of silicon nitride ($Si_3N_4$) is subsequently deposited on top of the GaN layer by plasma-enhanced chemical vapor deposition (PECVD) to protect the surface of the GaN layer during subsequent procedures. The wafer is then cleaned with acetone followed by isopropanol in an ultrasonic bath and immediately blown dry with nitrogen after removal of the wafer from the isopropanol. The wafer is then transferred to an MOCVD reactor where an approximately 4 μm thick GaN layer is epitaxially grown on the remaining exposed sapphire surface. After growth, the GaN layer is annealed in a box furnace at 700° C. for 30 minutes. The $Si_3N_4$ layer is then removed using a buffered oxide etch (BHF), producing a sapphire wafer with a 4 μm thick GaN layer on each side of the sapphire wafer.

Following is an example illustrative of the present invention. It should be understood that this is presented as an example only, and should not be considered as limiting the scope of this invention which would include other embodiments not shown. Of course, there are other variations, modifications, and alternatives.

EXAMPLE 5

Preparation of a Seed Crystal

An approximately 4 μm thick GaN layer is epitaxially grown by MOCVD on one side of a 2 inch, c-plane, double-side polished sapphire wafer. The GaN layer is then annealed in a box furnace at 700° C. for 30 minutes to remove hydrogen from the GaN layer. A 1600 Å thick layer of silicon dioxide ($SiO_2$) is subsequently deposited on top of the GaN layer by sputter deposition to protect the surface of the GaN layer during subsequent procedures. The wafer is then cleaned with acetone followed by isopropanol in an ultrasonic bath and immediately blown dry with nitrogen after removal of the wafer from the isopropanol. The wafer is then transferred to an MOCVD reactor where an approximately 4 μm thick GaN layer is epitaxially grown on the remaining exposed sapphire surface. After growth, the $SiO_2$ layer is subsequently removed using a buffered oxide etch (BHF), producing a sapphire wafer with a 4 μm thick GaN layer on each side of the sapphire wafer.

Following is an example illustrative of the present invention. It should be understood that this is presented as an example only, and should not be considered as limiting the scope of this invention which would include other embodiments not shown. Of course, there are other variations, modifications, and alternatives.

EXAMPLE 6

Preparation of a Seed Crystal

An approximately 4 μm thick GaN layer is epitaxially grown by MOCVD on one side of a 2 inch, c-plane, double-side polished sapphire wafer. The GaN layer is then annealed in a box furnace at 700° C. for 30 minutes to remove hydrogen from the GaN layer. A 1660 Å thick layer of silicon nitride (Si3N4) is subsequently deposited on top of the GaN layer by PECVD to protect the surface of the GaN layer during subsequent procedures. The wafer is then cleaned with acetone followed by isopropanol in an ultrasonic bath and immediately blown dry with nitrogen after removal of the wafer from the isopropanol. The wafer is then transferred to an MOCVD reactor where an approximately 4 μm thick GaN layer is epitaxially grown on the remaining exposed sapphire surface. The Si3N4 layer is then removed using a buffered oxide etch (BHF), producing a sapphire wafer with a 4 μm thick GaN layer on each side of the sapphire wafer.

As used herein, the term GaN substrate is associated with Group III-nitride based materials including GaN, InGaN, AlGaN, or other Group III containing alloys or compositions that are used as starting materials. Such starting materials include polar GaN substrates (i.e., substrate where the largest area surface is nominally an (h k l) plane wherein h=k=0, and l is non-zero), non-polar GaN substrates (i.e., substrate material where the largest area surface is oriented at an angle ranging from about 80-100 degrees from the polar orientation described above towards an (h k 1) plane wherein 1=0, and at least one of h and k is non-zero) or semi-polar GaN substrates (i.e., substrate material where the largest area surface is oriented at an angle ranging from about +0.1 to 80 degrees or 110-179.9 degrees from the polar orientation described above towards an (h k 1) plane wherein 1=0, and at least one of h and k is non-zero). Of course, there can be other variations, modifications, and alternatives While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method of fabricating crystalline material comprising:
   providing a crystalline substrate having a first surface and a second opposite surface;
   forming a first layer of crystalline material containing at least a Group III element and N having a first thickness overlying the first surface of the substrate; and
   forming a second layer of crystalline material overlying the second surface of the substrate, the second crystalline material having substantially the same first thickness and having substantially the same composition as the first layer of crystalline material, such that the first crystalline material and second crystalline material are substantially free from bow;
   wherein the first layer is formed by a process selected from MOCVD, HVPE, LPE, and MBE; and the second layer is formed by a process selected from MOCVD, HVPE, LPE, and MBE.

2. The method of claim 1 wherein the structure substantially free from bow is then used as a seed for growth.

3. The method of claim 1 wherein the first layer of crystalline material and the second layer of crystalline material are formed at the same time.

4. The method of claim 1 wherein the crystalline substrate comprises two separate crystalline wafers that have been bonded or fused together.

5. An epitaxial layer grown on crystalline material wherein the crystalline material is fabricated by a method comprising:
   providing a crystalline substrate having a first surface and a second opposite surface;
   forming a first layer of crystalline material containing at least a Group III element and N having a first thickness overlying the first surface of the substrate; and
   forming a second layer of crystalline material overlying the second surface of the substrate, the second crystalline material having substantially the same first thickness and having substantially the same composition as the first layer of crystalline material, such that the first crystalline material and second crystalline material are substantially free from bow.

6. The method of claim 1 wherein the first layer of crystalline material or the second layer of crystalline material has an orientation within 10 degrees of (10-10) or (11-20), along with their associated family of planes.

7. The method of claim 1 wherein the first layer of crystalline material or the second layer of crystalline material has a semipolar orientation.

8. The method of claim 7 wherein a semipolar orientation refers to a plane with an orientation within 5 degrees of (10-11), (10-1-1), (10-12), (10-1-2), (10-13), (10-1-3), (11-21), (11-2-1), (20-21), (20-2-1),(10-14), (10-1-4), (11-22),or (11-2-2), along with their associated families of planes.

9. The method of claim 1 wherein the first layer and the second layer are within 500 microns of each other in thickness.

10. The method of claim 1 further comprising at least one overlying layer covering the first layer deposited on the first layer prior to forming the second layer.

11. A method of fabricating crystalline material comprising:
    providing a first crystalline substrate material having a first surface and a second surface;
    forming a first thickness of first crystalline material overlying the first surface of the first crystalline substrate material, the first thickness of first crystalline material having a first orientation;
    providing a second crystalline substrate material having a first surface and a second surface;
    forming a second thickness of second crystalline material overlying the first surface of the second crystalline substrate material, the second thickness of second crystalline material having a second orientation; and
    attaching the first crystalline substrate and the second crystalline substrate to form a composite substrate such that the composite substrate is configured to be substantially free from bow.

12. The method of claim 11 wherein the step of attaching is performed by a process selected from wafer fusion, wafer bonding, semiconductor wafer bonding, solder bonding, thermocompression bonding, eutectic bonding, and diffusion bonding.

13. The method of claim 11 wherein at least one material is disposed between the first crystalline substrate and the second crystalline substrate.

14. The method of claim 11 wherein the attaching uses at least one material disposed between the first crystalline substrate and the second crystalline substrate.

15. A method of fabricating crystalline material containing at least a Group III element and N comprising:
    providing a crystalline substrate having a first surface and a second opposite surface;
    forming a first layer of crystalline material having a first thickness overlying the first surface of the crystalline substrate; and
    forming a second layer of crystalline material overlying the second surface of the crystalline substrate, the second layer of crystalline material having substantially the same first thickness and having substantially the same composition as the first layer of crystalline material overlying the first surface of the crystalline substrate, such that the crystalline substrate together with the first layer of crystalline material and the second layer of crystalline material creates a structure that is substantially free from bow.

16. The method of claim 15 wherein the first layer of crystalline material and the second layer of crystalline material are formed at the same time.

17. A method for fabricating crystalline material comprising:
    providing a first crystalline substrate material having a first surface and a second surface;
    forming a first thickness of first crystalline material overlying the first surface of the first crystalline substrate material, the first thickness of first crystalline material having a first orientation;
    providing a second crystalline substrate material having a first surface and a second surface;
    forming a second thickness of second crystalline material overlying the first surface of the second crystalline substrate material, the second thickness of second crystalline material having a second orientation; and attaching the first crystalline substrate and the second crystalline substrate at their second surfaces, such that the first crystalline material and second crystalline material are substantially free from bow.

18. The method of claim 17 wherein the attaching is performed by a process selected from wafer fusion, wafer bonding, semiconductor wafer bonding, solder bonding, thermocompression bonding, eutectic bonding, and diffusion bonding.

19. The method of claim 17 wherein the first orientation of the first crystalline material and the second orientation of the second crystalline material have an orientation within 10 degrees of each other.

20. The method of claim 17 wherein the first orientation of the first crystalline material and the second orientation of the second crystalline material have an orientation within 170-190 degrees of each other.

21. The method of claim 17 wherein the first orientation of the first crystalline material or the second orientation of the second crystalline material comprise a nonpolar orientation.

22. The method of claim 17 wherein the first orientation of the first crystalline material or the second orientation of the second crystalline material comprise a semipolar orientation.

23. The method of claim 17 wherein the first orientation of the first crystalline material or the second orientation of the second crystalline material have an orientation within 10 degrees of a (0001) or a (000-1) crystallographic orientation.

24. The method of claim 17 wherein the crystalline substrate contains one or more materials selected from the group consisting of sapphire ($Al_2O_3$), silicon carbide (SiC), silicon (Si), spinel ($MgAl_2O_4$), $LiGaO_2$, $LiAlO_2$, $ZrB_2$ a Group III-V material, and a Group II-VI material.

25. The method of claim 17 wherein the first crystalline material and the second crystalline material comprise a wurtzite crystal structure.

26. A method for fabricating crystalline material comprising:

providing a crystalline substrate material having a first surface and a second surface;

forming a first crystalline material overlying the first surface of the crystalline substrate material, the first crystalline material having a first lattice constant; and forming a second crystalline material overlying the second surface of the crystalline substrate material, the second crystalline material having a second lattice constant, such that the lattice constant of the second crystalline material is substantially the same as the lattice constant of the first crystalline material.

27. The method of claim 26 wherein the crystalline substrate material, the first crystalline material, and the second crystalline material are substantially free from bow.

28. The method of claim 26 wherein the first crystalline material and the second crystalline material are substantially free from bow.

29. The method of claim 26 wherein the first crystalline material and the second crystalline material comprise a wurtzite crystal structure.

30. A method of fabricating crystalline material comprising:

providing a first crystalline substrate material having a first surface and a second surface;

forming a first thickness of first crystalline material overlying the first surface of the first crystalline substrate material, the first thickness of first crystalline material having a first orientation;

providing a second crystalline substrate material having a first surface and a second surface;

forming a second thickness of second crystalline material overlying the first surface of the second crystalline substrate material, the second thickness of second crystalline material having a second orientation; and forming a composite structure containing the first crystalline substrate material, the first crystalline material, the second crystalline substrate material, and the second crystalline material such that the surface of the first crystalline material is disposed opposite the surface of the second crystalline material.

31. The method of claim 30 wherein the composite structure is configured to be substantially free from bow.

32. The method of claim 30 wherein a material is disposed between the first crystalline substrate material and the second crystalline substrate material.

33. The method of claim 30 wherein the first orientation of the first crystalline material and the second orientation of the second crystalline material have an orientation within 10 degrees of each other.

34. The method of claim 30 wherein the first orientation of the first crystalline material and the second orientation of the second crystalline material have an orientation within 170-190 degrees of each other.

35. The method of claim 30 wherein the first orientation of the first crystalline material or the second orientation of the second crystalline material comprise a nonpolar orientation.

36. The method of claim 30 wherein the first orientation of the first crystalline material or the second orientation of the second crystalline material comprise a semipolar orientation.

37. The method of claim 30 wherein the first orientation of the first crystalline material or the second orientation of the second crystalline material have an orientation within 10 degrees of (0001) or (000-1) crystallographic orientations.

38. A method of fabricating crystalline material comprising:

providing a first crystalline substrate material having a first surface and a second surface;

forming a first thickness of first crystalline material overlying the first surface of the first crystalline substrate material, the first crystalline material having a first lattice constant;

providing a second crystalline substrate material having a first surface and a second surface;

forming a second thickness of second crystalline material overlying the first surface of the second crystalline substrate material, the second crystalline material having a second lattice constant, such that the lattice constant of the second crystalline material is substantially the same as the lattice constant of the first crystalline material; and forming a composite structure containing the first crystalline substrate material, the first crystalline material, the second crystalline substrate material, and the second crystalline material such that the surface of the first crystalline material is disposed opposite the surface of the second crystalline material.

39. The method of claim 38 wherein the composite structure is configured to be substantially free from bow.

40. The method of claim 38 wherein a material is disposed between the first crystalline substrate material and the second crystalline substrate material.

41. The method of claim 38 wherein the first crystalline material and the second crystalline material comprise a wurtzite crystal structure.

42. A method of fabricating crystalline material comprising:
- providing a first crystalline substrate material having a first surface and a second surface;
- forming a first thickness of first crystalline material overlying the first surface of the first crystalline substrate material, the first crystalline material having a first coefficient of thermal expansion;
- providing a second crystalline substrate material having a first surface and a second surface;
- forming a second thickness of second crystalline material overlying the first surface of the second crystalline substrate material, the second crystalline material having a second coefficient of thermal expansion, such that the coefficient of thermal expansion of the second crystalline material is substantially the same as the coefficient of thermal expansion of the first crystalline material; and
- forming a composite structure containing the first crystalline substrate material, the first crystalline material, the second crystalline substrate material, and the second crystalline material such that the surface of the first crystalline material is disposed opposite the surface of the second crystalline material.

43. The method of claim 42 wherein the composite structure is configured to be substantially free from bow.

44. The method of claim 43 wherein the composite structure is configured so the first crystalline material or the second crystalline material is substantially free from bow.

45. The method of claim 43 wherein a material is disposed between the first crystalline substrate material and the second crystalline substrate material.

\* \* \* \* \*